(12) United States Patent
Konno et al.

(10) Patent No.: US 7,778,807 B2
(45) Date of Patent: Aug. 17, 2010

(54) SIMULATION MODEL GENERATOR OF CAUSALITY PHENOMENA AND EVENTS

(75) Inventors: Hiroyuki Konno, Yokohama (JP); Kenichi Funaki, Tokyo (JP); Yasunori Yamashita, Tokyo (JP); Akira Nagamatsu, Yokohama (JP); Takahiro Ogura, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 685 days.

(21) Appl. No.: 11/700,040

(22) Filed: Jan. 31, 2007

(65) Prior Publication Data
US 2007/0192081 A1 Aug. 16, 2007

(30) Foreign Application Priority Data
Feb. 3, 2006 (JP) ............... 2006-026501

(51) Int. Cl.
G06F 7/60 (2006.01)
(52) U.S. Cl. .......................................... 703/2
(58) Field of Classification Search ............ 703/22, 703/2; 705/10
See application file for complete search history.

(56) References Cited

U.S. PATENT DOCUMENTS

| | | | | |
|---|---|---|---|---|
| 6,321,205 | B1 * | 11/2001 | Eder ............................. | 705/7 |
| 6,708,156 | B1 * | 3/2004 | Gonten ......................... | 705/10 |
| 6,853,920 | B2 * | 2/2005 | Hsiung et al. .................. | 702/1 |
| 6,970,754 | B1 * | 11/2005 | Nanbu et al. .................. | 700/97 |
| 7,177,834 | B1 * | 2/2007 | Maestle ......................... | 705/38 |
| 2003/0144746 | A1 * | 7/2003 | Hsiung et al. ................. | 700/28 |
| 2006/0041466 | A1 * | 2/2006 | Woehler ....................... | 705/10 |
| 2007/0027736 | A1 * | 2/2007 | Reynolds et al. ............... | 705/8 |
| 2007/0094219 | A1 * | 4/2007 | Kipersztok .................... | 706/52 |
| 2007/0112746 | A1 * | 5/2007 | Todhunter ..................... | 707/4 |
| 2008/0059215 | A1 * | 3/2008 | Boyd ............................ | 705/1 |

OTHER PUBLICATIONS

Parker et al., Continuous Simulation of Air Base Assets (CSAA) "Integrating Logistics Support Operations" A Proposed Methodology, 1997, Proceedings of the 1997 Winter Simulation Conference, pp. 955-960.*

Parker, Forecasting Investment Opportunities Through Dynamic Simulation, 1997, Proceedings of the 1997 Winter Simulation Conference, pp. 1251-1257.*

(Continued)

Primary Examiner—Paul L Rodriguez
Assistant Examiner—Aniss Chad
(74) Attorney, Agent, or Firm—Mattingly & Malur, P.C.

(57) ABSTRACT

A simulation model generator presents a screen view which defines causality between phenomena and events using nodes and links to support user's input operation. The generator includes a database for storing and controlling in a centralized way, metric information representing, for each of the registered phenomena and events, a quantity indicating a magnitude of the phenomenon or the event; unit information including, for each unit, a unit name, a conversion coefficient, and a time flag determining whether the unit is associated with time; coefficient information including coefficient name and coefficient value to be used in a metrics calculation formula, and a simulation time bucket representing a period of time per time step in the simulation; and a simulation model generating module for generating a simulation model using data registered to the database.

3 Claims, 22 Drawing Sheets

OTHER PUBLICATIONS

Talbot, Semantic Networks: A unifying Framework for Multistrategy Reasoning, 2003, Technology Review Journal, pp. 59-76.*

Talbot et al, Knowledge Visualization: Redesigning the Human-Computer Interface, 2005, Technology Review Journal, pp. 37-55.*

Forrester, Market Growth as Influende by Capital Investment, 1975, Productivity Press.*

Membrillo et al., Applying System-Wide Discovery Analysis to the Market Growth model, 2000, The Strategic Decision Simulation Group.*

A. Uchiyama, "Visualization of Economic Trend after Bubble Economy by SD", JSD Conference, Oct. 23, 2004 (with translation).

* cited by examiner

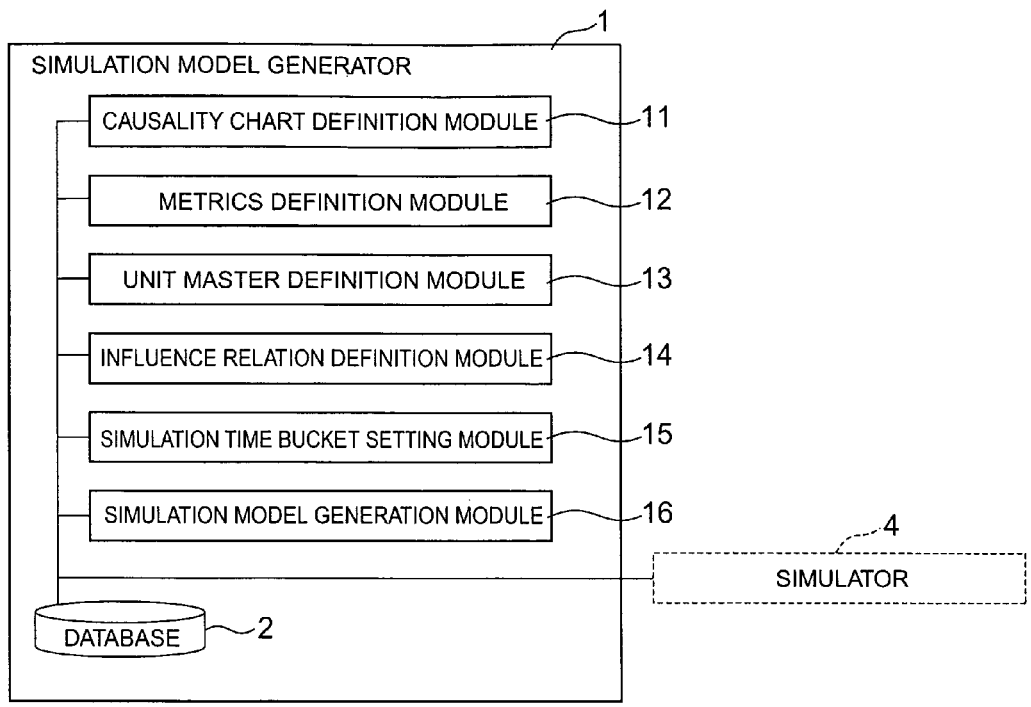
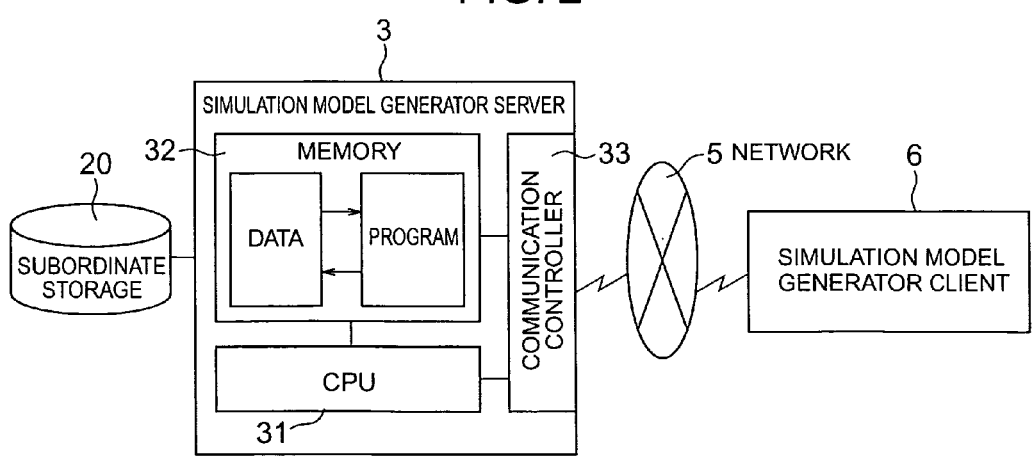

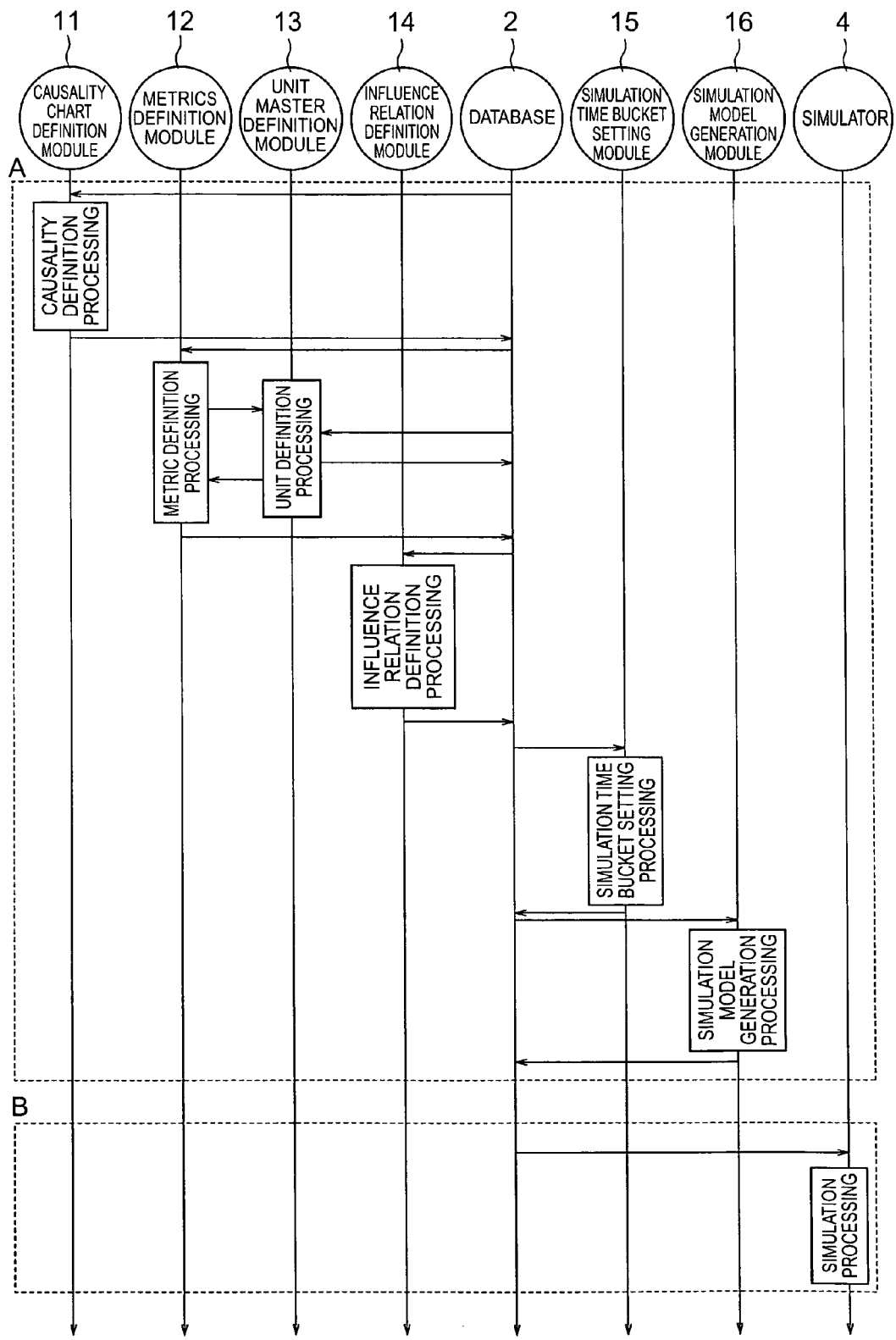

FIG. 7

METRICS TABLE 201

| | A | | B | | | |
|---|---|---|---|---|---|---|
| MODEL 1 | SALES INCREASE | 180,40 | SALES | ¥/DAY | MONTH | SALES ITEMS × AVERAGE SALES × CONSUMPTION TAX RATE |
| MODEL 1 | INCREASE IN SALES ITEMS | 130,130 | No. OF SALES ITEMS | ITEMS/DAY | MONTH | 0 |
| MODEL 1 | AVERAGE SALES INCREASE | 230,130 | AVERAGE SALE | ¥/ITEMS | WEEK | ... |
| MODEL 1 | BRAND IMAGE DOWN | 50,190 | BRAND IMAGE | % | MONTH | ... |
| ... | ... | | ... | ... | ... | ... |

FIG. 8

LINK TABLE 202

| MODEL 1 | 1 | INCREASE IN SALES ITEMS | SALES INCREASE |
| MODEL 1 | 2 | AVERAGE SALES INCREASE | SALES INCREASE |
| MODEL 1 | 3 | SHARE UP | INCREASE IN SALES ITEMS |
| MODEL 1 | 4 | BRAND IMAGE | SHARE UP |
| ... | ... | ... | ... |

FIG. 9

METRICS DEFINITION

| SALES INCREASE | SALES | ¥/DAY ▼ | MONTH ▼ |
| INCREASE IN SALES ITEMS | NUMBER OF SALES ITEMS | ITEMS/DAY ▼ | MONTH ▼ |
| AVERAGE SALES INCREASE | AVERAGE SALE | ¥/ITEMS ▼ | WEEK ▼ |
| BRAND IMAGE DOWN | BRAND IMAGE | % ▼ | MONTH ▼ |
| ... | ... | ... ▼ | ... ▼ |

[UNIT MASTER SETTING]   [CLOSE] [CANCEL]

FIG. 10

| | | | 203 |
|---|---|---|---|
| SECOND | 1 | – | ON |
| MINUTE | 60 | SECOND | ON |
| HOUR | 60 | MINUTE | ON |
| DAY | 24 | HOUR | ON |
| WEEK | 7 | DAY | ON |
| MONTH | 30 | WEEK | ON |
| ¥ | 1 | – | OFF |
| k¥ | 1000 | ¥ | OFF |
| ... | ... | ... | ... |

FIG. 11

UNIT MASTER DEFINITION

| UNIT | COEFFICIENT | BASE UNIT | TIME FLAG |
|---|---|---|---|
| SECOND | 1 | – | ◎ON ○OFF |
| MINUTE | 60 | SECOND | |
| HOUR | 60 | MINUTE | |
| DAY | 24 | HOUR | |
| WEEK | 7 | DAY | |
| MONTH | 30 | MONTH | |
| ¥ | 1 | – | ○ON ◎OFF |
| k¥ | 1000 | ¥ | |
| ... | ... | ... | |

[CLOSE] [CANCEL]

FIG. 14

INFLUENCE RELATION DEFINITION

| NODE NAME | METRICS NAME | UNIT | OUTPUT TIME BUCKET | METRICS INITIAL VALUE |
|---|---|---|---|---|
| SALES INCREASE ▼ | SALES | ¥/DAY | MONTH | 0 |

INFLUENCE RELATION INFORMATION

| LINK METRICS NAME | UNIT |
|---|---|
| NUMBER OF SALES ITEMS | ITEMS/DAY |
| AVERAGE SALE | ¥/ITEMS |

| COEFFICIENT NAME | UNIT | VALUE |
|---|---|---|
| CONSUMPTION TAX RATE | % | 1.05 |

A

EXPRESSION

| SALES ITEMS × CONSUMPTION TAX RATE | GRAPH FUNCTION |

EXPRESSION JUDGMENT

"AVERAGE SALES" METRICS NOT USED

[ CLOSE ]  [ CANCEL ]

SALES ITEMS × AVERAGE SALES × CONSUMPTION TAX RATE       B

FIG. 15

COEFFICIENT TABLE 204

| MODEL 1 | CONSUMPTION TAX RATE | % | 1.05 |
|---|---|---|---|
| ... | ... | ... | ... |

FIG. 18

SIMULATION TIME BUCKET TABLE 205

| MODEL 1 | DAY |
|---------|-----|
| ...     | ... |

FIG. 19

CAUSALITY CHART READOUT

INPUT SIMULATION MODEL NAME

| MODEL NAME | MODEL 1 | ▼ |

CLOSE

CANCEL

SIMULATION MODEL GENERATION FLOWCHART

FIG. 26

SIMULATION MODEL TABLE 206

| | | | | | | |
|---|---|---|---|---|---|---|
| MODEL 1 | $R_{A1}(t)$ | RATE | $t_{end}$ | SALES | ¥/DAY | — | $R_{A1}(t)=R_{A2}(t) \times R_{A3}(t) \times$ CONSUMPTION TAX RATE |
| MODEL 1 | $L_1(t)$ | LEVEL | $t_{end}$ | — | — | 0 | $L_1(t)=L_1(t-dt)+[R_{A1}(t)-R_{B1}(t)]dt$ |
| MODEL 1 | $R_{B1}(t)$ | RATE | $t_{end}$ | — | — | — | $R_{B1}(t)=R_{B1}(t_0)+L_1(t-dt)\left\{1-e^{-\left(\frac{t-t_0}{t_1}\right)^p}\right\} e^{-\frac{t-t_0}{1[\text{MONTH}]}}$ |
| MODEL 1 | $R_{A2}(t)$ | RATE | $t_{end}$ | AVERAGE SALE | ¥/ITEMS | — | $R_{A2}(t)=R_{A4}(t) \times$ DISCOUNT RATE |
| MODEL 1 | $R_{A3}(t)$ | RATE | $t_{end}$ | NUMBER OF SALES ITEMS | ITEMS/DAY | — | $R_{A3}(t)=\cdots$ |
| MODEL 1 | $L_3(t)$ | LEVEL | $t_{end}$ | — | — | — | $L_3(t)=L_3(t-dt)+[R_{A3}(t)-R_{B3}(t)]dt$ |
| MODEL 1 | $R_{B3}(t)$ | RATE | $t_{end}$ | — | — | — | $R_{B3}(t)=R_{B3}(t_0)+L_3(t-dt)\left\{1-e^{-\left(\frac{t-t_0}{t_1}\right)^p}\right\} e^{-\frac{t-t_0}{1[\text{WEEK}]}}$ |
| MODEL 1 | $R_{A4}(t)$ | RATE | $t_{end}$ | PRICE | ¥/ITEMS | — | $R_{A4}(t)=\cdots$ |
| MODEL 1 | CONSUMPTION TAX RATE | COEFFICIENT | 1 | — | % | 1.05 | — |
| MODEL 1 | DISCOUNT RATE | COEFFICIENT | 1 | — | % | 0.98 | — |
| ⋮ | ⋮ | ⋮ | ⋮ | ⋮ | ⋮ | ⋮ | ⋮ |

SIMULATION DATA TABLE 207

| | | |
|---|---|---|
| MODEL 1 | $R_{A1}(0)$ | NULL |
| MODEL 1 | $R_{A1}(1)$ | NULL |
| MODEL 1 | $R_{A1}(2)$ | NULL |
| MODEL 1 | $R_{A1}(\cdots)$ | NULL |
| MODEL 1 | $R_{A1}(t_{end})$ | NULL |
| MODEL 1 | $L_1(0)$ | 0 |
| MODEL 1 | $L_1(1)$ | NULL |
| MODEL 1 | $L_1(2)$ | NULL |
| MODEL 1 | $R_1(\cdots)$ | NULL |
| MODEL 1 | $L_1(t_{end})$ | NULL |
| MODEL 1 | CONSUMPTION TAX RATE | 1.05 |
| ... | ... | ... |

SIMULATION MODEL GENERATOR OF CAUSALITY PHENOMENA AND EVENTS

INCORPORATION BY REFERENCE

The present application claims priority from Japanese application JP2006-026501 filed on Feb. 3, 2006, the content of which is hereby incorporated by reference into this application.

BACKGROUND OF THE INVENTION

The present invention relates to a method of generating a simulation model to conduct simulation of phenomena and events occurring in, for example, the economic and social environments by representing the phenomena and the events in terms of causality.

For a company to achieve better and advantageous decision making as compared with competing companies, it is essential to construct a decision making support system in which appropriate information items are gathered at an early stage to prepare an appropriate strategic step prior to the other companies. For this purpose, a simulation to predict the future will be efficiently utilized. There exists two types of simulations, that is, simulations of discrete type in which the simulation is conducted by handling events and simulations of continuous type in which values of variables continuously change on the time axis or with respect to time. For example, Akira Uchiyama, "Visualization of Economic Trend after Bubble Economy by SD", JSD Conference, Oct. 23, 2004 describes that the simulation of continuous type in which feedback loops of chains and microscopic events can be dispensed with is efficiently used in the chain prediction of causality in the political decision making or in the chain prediction of causality, for example, to determine how a price of new products exerts influences when the new products are put to the market. Also, according to the article, the system dynamics technique is generally suitable as a simulator of continuous type for a system including causality in social phenomena taking place in the world. The system dynamics technique is proposed and developed by Forester at the Massachusetts Institute of Technology (MIT) and is a method of simulating transient phenomena by describing phenomena in the form of difference equations. According to the system dynamics, a model is configured by combining two kinds of symbols (variables), namely, a rate indicating a flow rate of a substance and a level indicating accumulation of the substance.

In a simulation model generation method of system dynamics, a model is constructed by setting relationships between rates and levels by use of a text-type programming technique called Dynamo and visual screen images such as those used in an associated tool available in the market.

In the simulation model generation of the system dynamics, it is quite important to determine which one of the rate and the level is adopted for the object of which a model is to be generated. However, for invisible factors such as social phenomena which are difficult to visually recognized, there does not exist any index or guidance for how to generate a model by use of rates and levels. Therefore, until the user has a sufficient deal of experience in the simulation model generation, it is required for the user to construct the simulation model in the try and error method. This requires a large amount of human power and time.

SUMMARY OF THE INVENTION

To achieve the object according to the present invention, there is provided a simulation model generator for generating a simulation model of a simulator which conducts simulation by representing phenomena and events in terms of causality. The generator includes a module for presenting a screen which defines causality between the phenomena and the events using nodes and links to a user, receiving inputs from the user, and registering information regarding each of the nodes and information regarding each of the links connecting the nodes to each other, a database for storing therein and controlling in a centralized way, metric information recorded using records each of which records, for each of the phenomena and the events thus registered, metrics quantitatively representing a quantity indicating a magnitude of the phenomenon or the event, the record including at least a metrics name, a unit, a metrics calculation formula, and an output time bucket indicating a period of time for totaling results of calculation; unit information recorded using records each of which includes, for each unit, at least a unit name, a conversion coefficient, and a time flag determining whether or not the unit is associated with time; coefficient information including a coefficient name and a coefficient value which are used in the metrics calculation formula; and a simulation time bucket representing a period of time per time step in the simulation; and a simulation model generating module for generating a simulation model using data registered to the database.

In the simulation model generator of the present invention, the simulation model generating module includes program templates of two kinds of patterns respectively for "data accumulation" and "flow rate calculation". The simulation model generating module applies the program template for data accumulation to the metrics calculation formula if the output time bucket of the metrics information is larger than the simulation time bucket. The simulation model generating module applies the program template for flow rate calculation to the metrics calculation formula if the output time bucket of the metrics information is less than the simulation time bucket.

According to the present invention, in an operation to generate a simulation model using information items of causality of phenomena and events, it is not required to discriminate the rate representing a flow rate unique to the system dynamics from the level representing accumulation. Therefore, the period of time to generate the simulation model can be remarkably reduced when compared with the conventional model generation method requiring the try and error procedure. In addition, it is also possible for even a non-expert not having knowledge of the system dynamics to construct a simulation model and to achieve simulation.

BRIEF DESCRIPTION OF THE DRAWINGS

FIG. 1 is a block diagram showing an embodiment of an information processing system implementing a simulation model generator according to the present invention.

FIG. 2 is a block diagram showing a hardware configuration in an embodiment of the simulation model generator.

FIG. 3 is a sequence chart showing communication in time series between respective modules of the simulation model generator, a database, and a simulator.

FIG. 7 is a diagram showing an image of a metrics table.

FIG. 8 is a diagram showing an image of a link table.

FIG. 9 is a diagram showing an image of a metrics definition view.

FIG. 10 is a diagram showing an image of a unit table.

FIG. 11 is a diagram showing an image of a unit master definition view.

FIG. 14 is a diagram showing an image of an influential relation definition view.

FIG. 15 is a diagram showing an image of a coefficient table.

FIG. 18 is a diagram showing an image of a simulation time bucket table.

FIG. 19 is a diagram showing an image of a causality chart readout view.

FIG. 26 is a diagram showing an image of a simulation model table.

DESCRIPTION OF THE EMBODIMENTS

Figure 4:
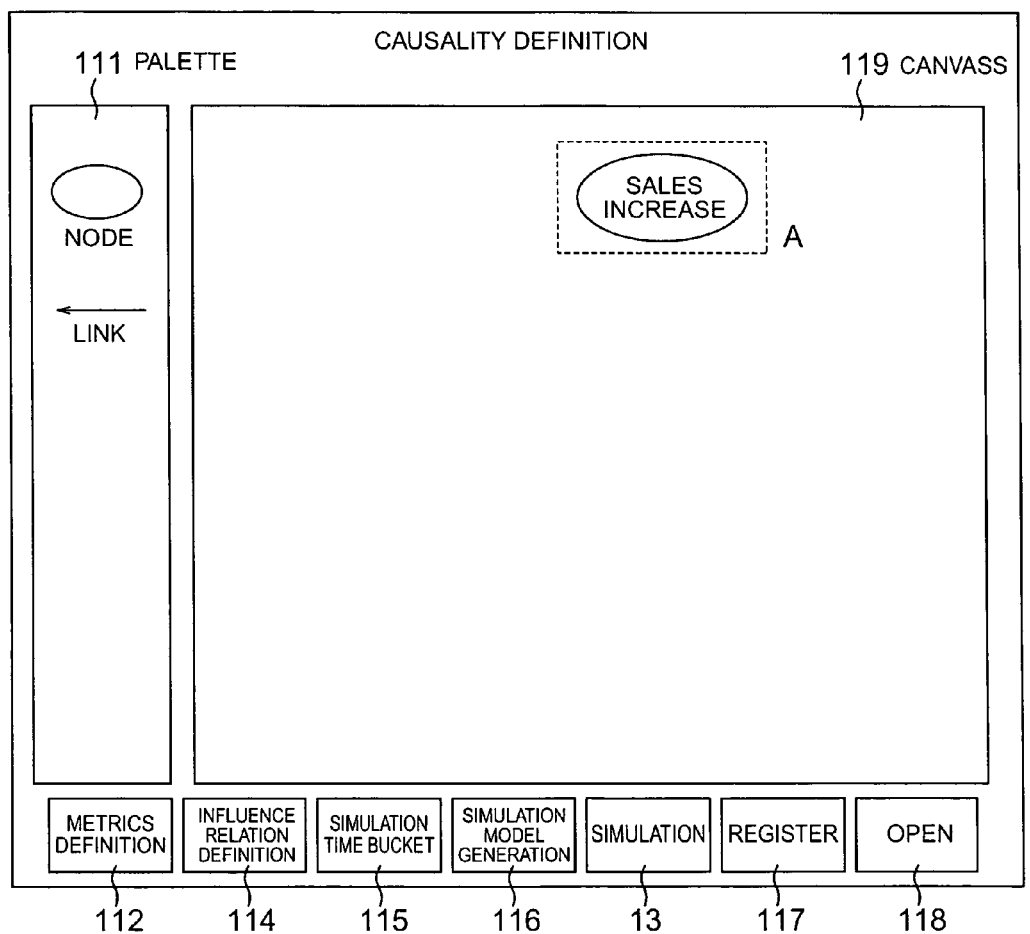
FIG. 4 is a diagram showing a screen image 1 of a causality chart definition module.

Referring now to the drawings, description will be given of a first embodiment of a simulation model generator according to the present invention. In the description of the embodiment, a relationship between a measure to enhance the sales of products and an resultant effect of the measure is represented using causality and then a simulation model of the system dynamics is automatically generated.

First, description will be given of the overall configuration of the simulation model generator according to the present invention.

FIG. 1 shows in a block diagram of a first embodiment of an information system to implement the simulation model generator of the present invention. As can be seen from FIG. 1, the simulation model generator 1 includes a metrics definition module 12 for setting metrics items to quantitatively represent a state of each node, a unit master definition module 13 for defining units which can be set to metrics items, an influence relation definition module 14 for defining relationships of influences between the metrics items, a simulation time bucket setting module 15 for setting a period per step in the execution of the simulation, a simulation model generation module 16, and a database 2 for storing therein results of execution of each of the constituent modules. By using the simulation model registered to the database, the simulator 4 carries out simulation.

Subsequently, description will be given of a hardware configuration of the simulation model generator 1. FIG. 2 shows the hardware configuration of an embodiment of the simulation model generator 1. The generator 1 operates on a computer shown in a server 3 of the generator 1. The server 3 includes a Central Processing Unit (CPU) 31, a memory 32, a communication controller 33, and a subordinate storage 20.

The modules of FIG. 1 are stored as programs of the simulation model generator in the subordinate storage 20 and are read therefrom to be loaded in the memory 32 for execution thereof according to necessity. Similarly, the database 2 of FIG. 1 is stored as a relational database and/or a file in the storage 20. According to necessity, the data is read from the database 2 to be used by the programs.

It is possible that a program of the simulation model generator creates on a computer of a client 6, data required for a program of the simulation model generator on the server 3 and registers the data via the network 5 to the storage 20. It is possible to configure the system including the server 3 and the storage 20, without using the client 6 and the network 5.

FIG. 3 shows, in a sequence chart, communication in time series between respective modules of the simulation model generator 1 and the database 2. FIGS. 4 to 21 show input and output data items and screen views as well as various algorithms used in respective phases described in conjunction with FIG. 3. Description will now be given of the present invention by referring to FIG. 3 and FIGS. 4 to 27.

First, description will be given of a processing sequence, shown in a dotted-line frame of FIG. 3, to prepare data for the server 3 of the simulation model generator. The causality definition module 11 includes a function to describe of causality between phenomena and events by use of nodes and links.

FIG. 4 shows an image of a screen view of the causality chart definition module 11. In FIG. 4, a canvass 119 is employed to describe the causality. The user draws structure of causality by moving a node and a link from a palette 111 to the canvass 119, specifically, by conducting the drag and drop operation for the node and the link. For example, when the user moves the node from the palette 111 to the area of the canvass 119 and inputs "sales up" as the node name, there is displayed image A as shown in FIG. 4.

Figures 5, 6:
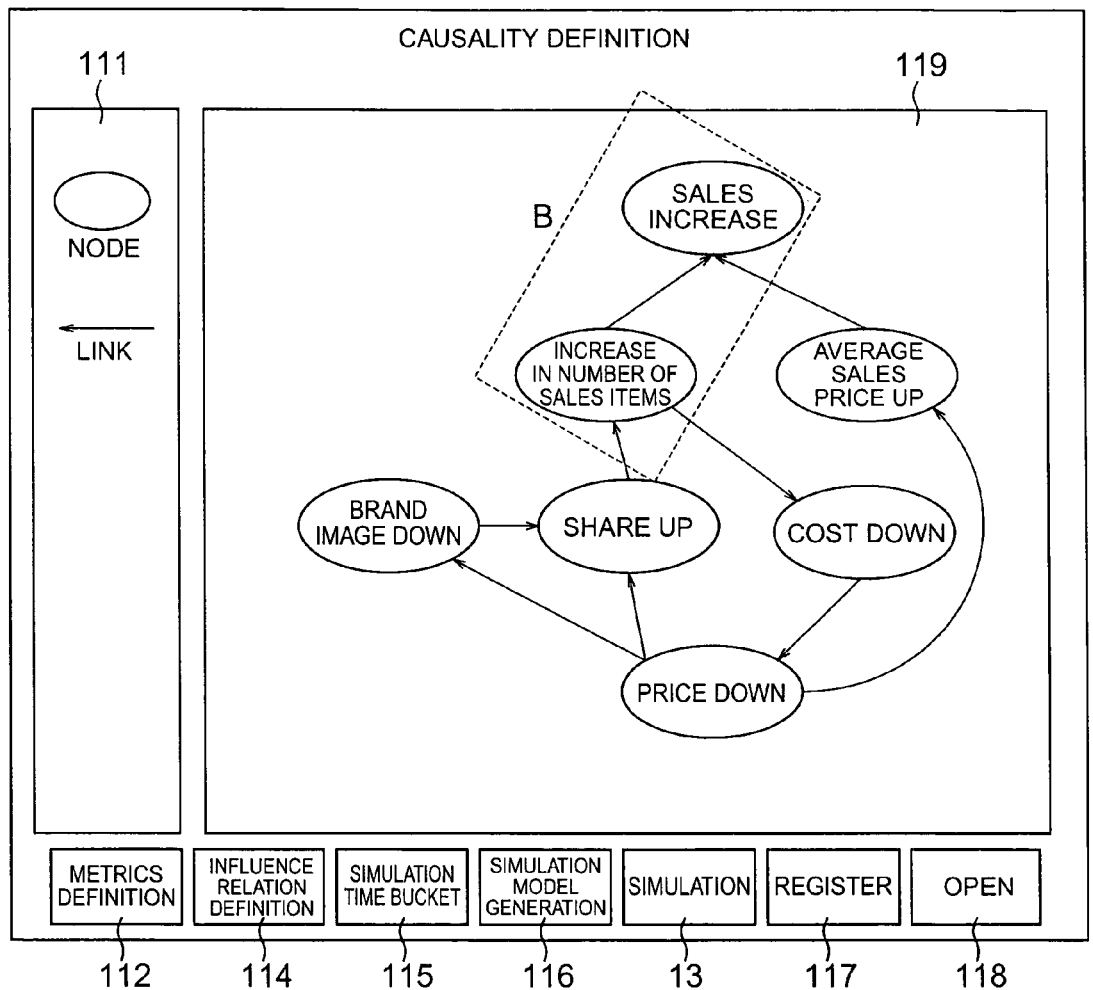
FIG. 5 is a diagram showing a screen image 2 of a causality chart definition module.
FIG. 6 is a diagram showing an image of a registration confirmation view.

In this way, the user moves nodes and links from the palette 111 to the canvass 119 through the drag and drop operation. As a result, there is produced, for example, a causality chart in the canvass 119 as shown in FIG. 5. The causality chart indicates "in an example of area B, if the number of sales items sold increases, the sales amount increases". That is, the chart expresses the direction of the cause and the effect. Specifically, the node on a last end of an arrow is the cause, and an event described in the node on a first end or on the arrowhead indicates the effect occurring as a result. If the user clicks a register button 117 in this situation, the system displays a registration confirmation view as shown in FIG. 6. If the user inputs a simulation model name ("model 1" in this case) and then depresses the register button, the system registers to the database 2 the data of the causality chart having been inputted up to this point.

FIGS. 7 and 8 show images of associated tables in the database 2. FIG. 7 shows an image of a metrics table 201, which will be described later in detail. A section in a dotted-line frame in FIG. 7 is used to register the node names of the nodes of the causality chart and the data items such as coordinates of nodes of the causality chart inputted using the canvass 119.

The model name inputted to the registration confirmation view is registered to the model name field. FIG. 8 shows an image of a link table 202. In the table, link information to link nodes with each other is registered for each model name. Each entry includes a model name field, a link identification (ID) field, a cause node name field, and an effect node name field. In this connection, an identifier (ID) of each link connecting nodes to each other is registered to the link ID field.

The cause node name field is employed to register thereto a node name of the node on the last end of the arrow indicated by the link ID. The effect node name field is employed to register thereto a node name of the node on the arrowhead of the link indicated by the link ID. Description has been given of the causality definition module 11 shown in FIG. 3.

Next, description will be given of the metrics definition module 12 and the unit master definition module 13. The metrics definition module 12 has a function to set, for each node generated by the causality definition module 11, a metrics item for quantitatively measuring a degree thereof, the unit thereof, etc.

FIG. 9 shows an image of a metrics definition view to implement the function. On a spreadsheet of the screen view, there are displayed the node name of the metrics table 201 of FIG. 7 and the metrics name, the unit, and the value of the output time bucket shown in area B of FIG. 7. When the screen view is first opened, only the node name field is beforehand set and the other fields are blank. For each node name, the user hence inputs a metrics name, a unit, and a value of an output time bucket. The output time bucket indicates a period of time to total metrics values calculated by the simulation.

The user may select the metrics unit from the menu of the list box. The menu list displays the value contained in the unit field of the unit table 203 shown in FIG. 10.

Similarly, the menu list of the list box of the output time bucket displays the value of the unit field of each record of the unit table 203 for which the time flag field is "on". After the respective items of FIG. 9 are inputted, when the user clicks the close button, the results of the input operation are registered to area B of the metrics table 201 and then the view is closed.

The unit master definition module 13 shown in FIG. 3 has a function to register kinds of units to be set to metrics items. FIG. 11 shows an image of a unit master definition view to realize the function. On the spreadsheet of the screen view, there are displayed a unit field, a coefficient field, a base unit field, an a time flag field. It can be seen from the spreadsheet that, for example, the unit of "minute" is 60 times the unit of "second".

If the base unit is absent, a hyphen "-" is recorded. In this situation, the definition of the unit is set using the time flag field to indicate whether or not the unit is associated with time. When the close button is clicked, the input results are reflected in the unit table 203 shown in FIG. 10. In this regard, the screen image is displayed by clicking the unit master setting button on the metrics definition view shown in FIG. 9.

Figure 12:
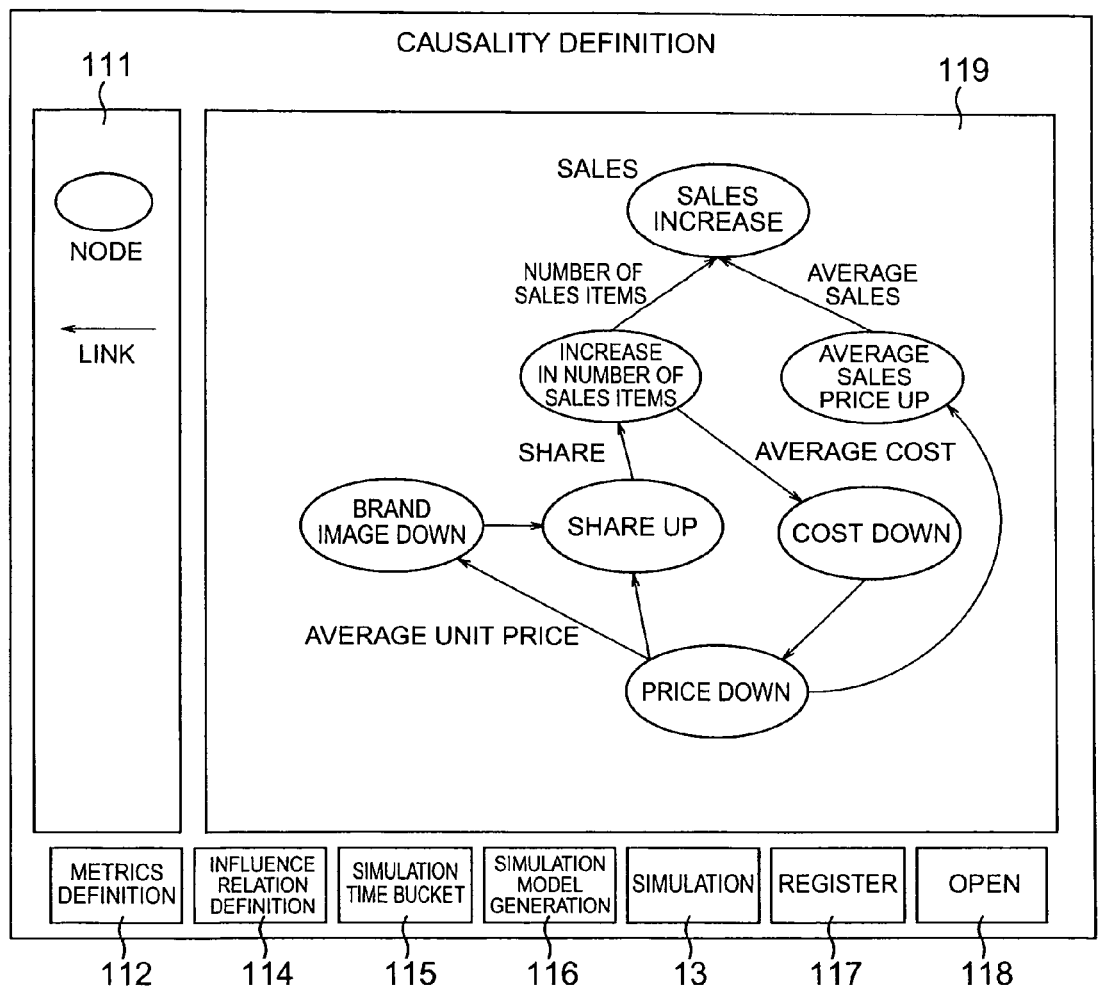
FIG. 12 is a diagram showing image 1 of a causality chart definition view.
Figure 13:
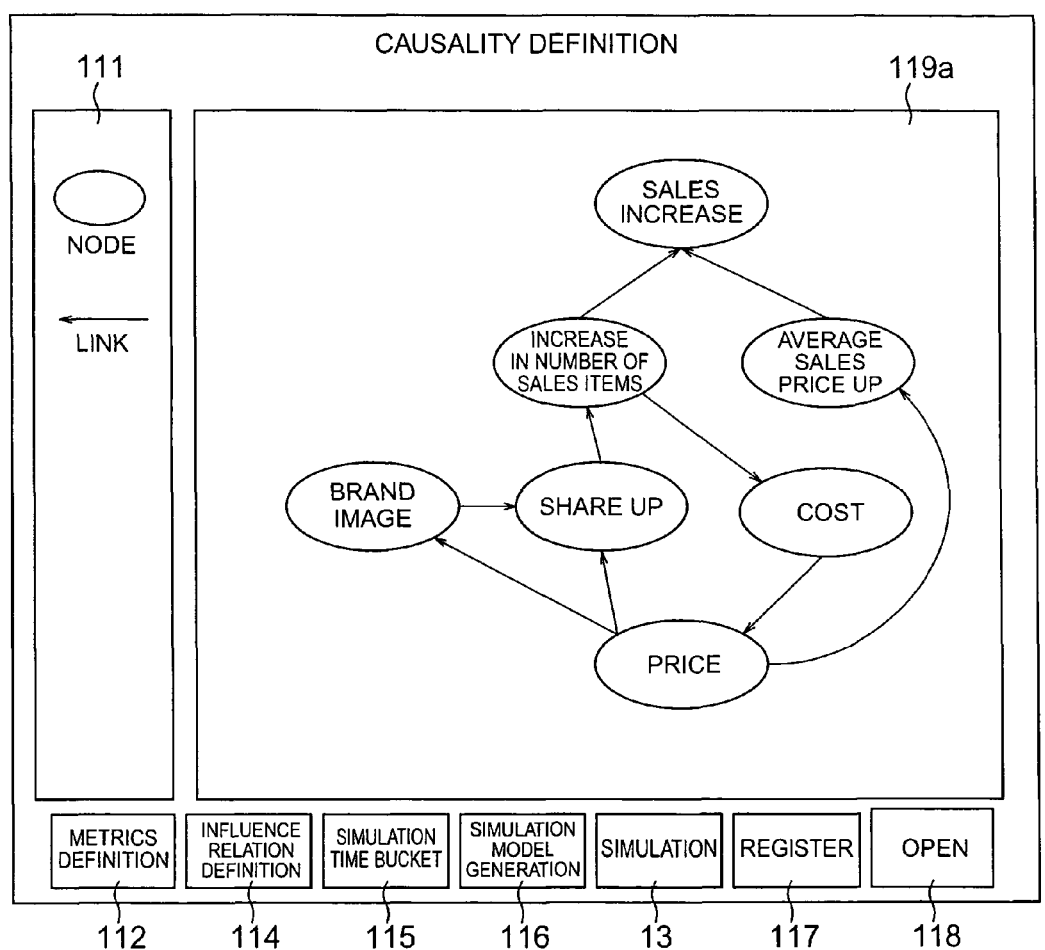
FIG. 13 is a diagram showing image 2 of a causality chart definition view.

As a result of the input operation in the metrics definition view, the metrics names thus set are reflected in the screen image as in the causality chart definition screen shown in FIG. 12. According to the embodiments described above, the information items of causality associated with phenomena and events are first described. Thereafter, metrics items are set so that quantities of magnitude thereof are measured for the respective nodes. This is because the sequence of the operation procedure matches with the process of human thinking.

However, there likely occurs a situation in which the user desires to first define relationships between metrics items according to phenomena and events which the user imagines. To cope with the situation, the causality chart definition view of FIG. 12 may be replaced by that shown in FIG. 13. Neither phenomena nor events are described in the canvass 119a. Causality between the metrics items are described the canvass 119a.

Description will now be given of the influence relation definition module 14 shown in FIG. 3. This module has a function to define an influence relationship indicating influence which a change in the value of a metrics item set to a cause node exerts on a metrics item set to an effect node associated with the cause node. FIG. 14 shows an image of an influence relation definition view to implement the function. In the list of node names, the node names inputted in the causality chart are displayed. The data therein contains the value of the node name field of the metrics table 201 shown in FIG. 7.

The user selects a node for which an influence relation is to be defined. According to the node, the system extracts the initial values respectively of the metrics name, the unit, the output time bucket, and the metrics item and influence relation information from the metrics table 201 to display the obtained information items on the screen. In the influence relation information column, there are displayed a metrics name and a unit thereof associated with the cause node linked with the pertinent node.

Description will now be briefly given of a method of extracting the display data. Using as a search key the value selected from the node name list described above, a search is made through the link table 202 for the effect node name field to obtain the value of the cause node name field associated with the effect node name field. According to the extracted value, a search is made through the metrics table 201 of FIG. 7 for the node name to resultantly obtain the metrics name and the unit.

In the expression column, the user describes a calculation formula including all metrics items displayed in the row of the metrics name. For example, data, which possibly is changed according to necessity, such as "consumption tax rate" can be set as indicated in area A of FIG. 14. The coefficient set as above may also be employed in a calculation formula for another metrics item. Therefore, when the value of "consumption tax rate" is changed, the change can be reflected in all expressions including "consumption tax rate" only by modifying the value in this field.

The column of "expression judgment" is a field in which the system displays a result of the check conducted for the expression or the calculation formula inputted by the user. The check is made for four points, that is, "the link metrics items are entirely used", "the units are appropriately aligned for addition or subtraction", "the unit of the inputted calculation formula can be converted into the unit of the metrics item of the pertinent node", and "the name used in the expression is beforehand registered as a link metrics name or a coefficient name".

For example, the link metrics item "average sales" is not used in the calculation formula described in FIG. 14, the system displays a message notifying the condition in the column of "expression judgment". Area B shows an example of an appropriate calculation formula.

Figures 16, 17:
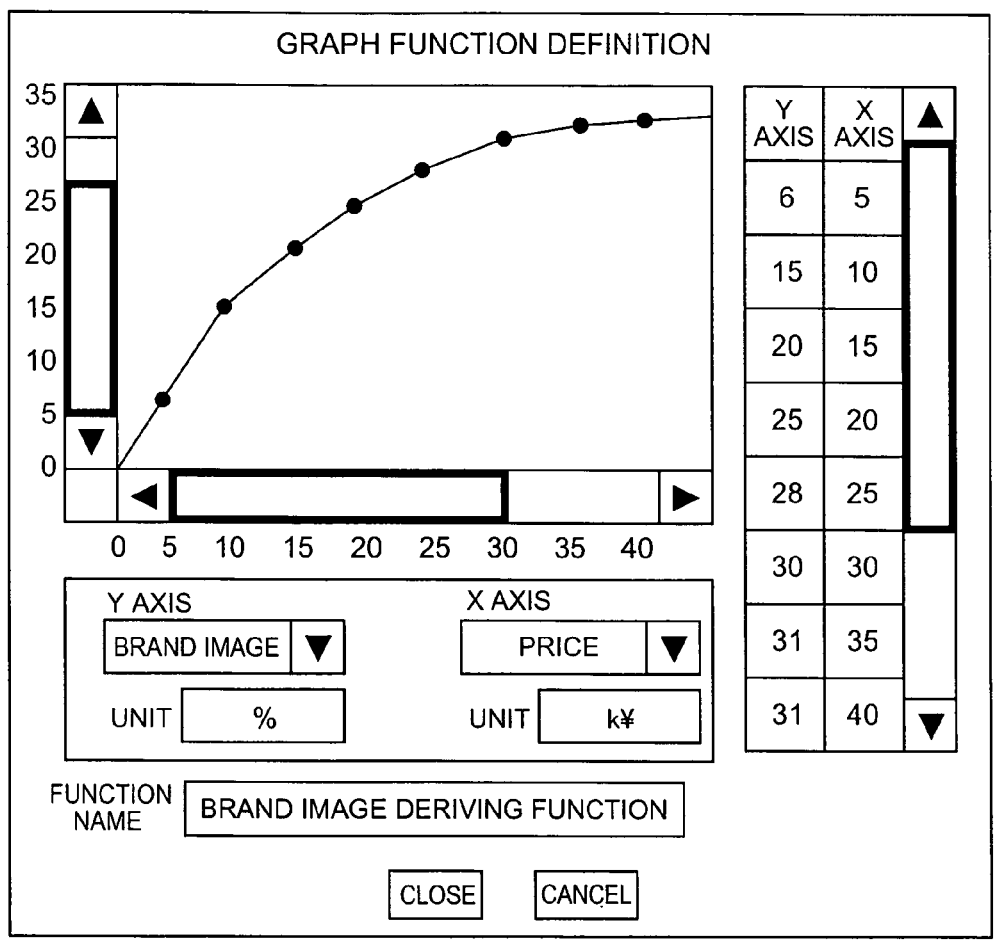
FIG. 16 is a diagram showing an image of a graph function definition view.
FIG. 17 is a diagram showing an image of a simulation time bucket setting view.

When the user clicks the graph function button of FIG. 14, the system displays a graph function definition view shown in FIG. 16. The view is a screen view to set a behavior of a function to calculate a relationship between two kinds of metrics items as well known, for example, for products of the system dynamics. It is possible for the user to set metrics items respectively for the X and Y axes and to graphically set the relationship therebetween by moving dots on the graph by a mouse. The function set as above is available in the column of the expression shown in FIG. 14.

When the user clicks the close button in FIG. 14, the system stores the calculation formula of the expression column in the expression field of the metrics table 201 shown in FIG. 7. The system also stores the data of area A in the coefficient table 204 of FIG. 15.

The simulation time bucket setting module 15 of FIG. 3 has a function to set a period of time per step in the execution of the simulation.

FIG. 17 shows an image of a simulation time bucket setting view to achieve the function. The screen image is displayed when the user clicks the simulation time bucket button in the causality definition view. The data in the list of the simulation time bucket setting screen is obtained from the unit field of the unit table 203 shown in FIG. 10. For the record in which the time flag is "on", the data is extracted from the unit field. The user selects either one of the items in the simulation bucket setting view. When the user clicks the close button, the system registers the result of selection to the simulation time bucket table 205 of FIG. 18.

The sequence described above is a sequence to prepare data required to automatically generate a simulation model in area A of FIG. 3. In this connection, to read data, which is beforehand registered to the database 2 by the register button 117, from the database 2, the user depresses the open button 118 to thereby read the data again therefrom. By clicking the open button 118, the system reads and displays the causality chart readout view shown in FIG. 19.

When the user selects from the list a model to be opened and then clicks the open button, data can be read from the system. The data displayed in the list menu is data created by collecting the model name fields of the metrics table 201.

Next, description will be given of the simulation model generation module 16. This module has a function to automatically generate a simulation model on the basis of the causality chart being opened at this point of time. The function can be called by depressing the simulation model generation button 116.

Figure 20:
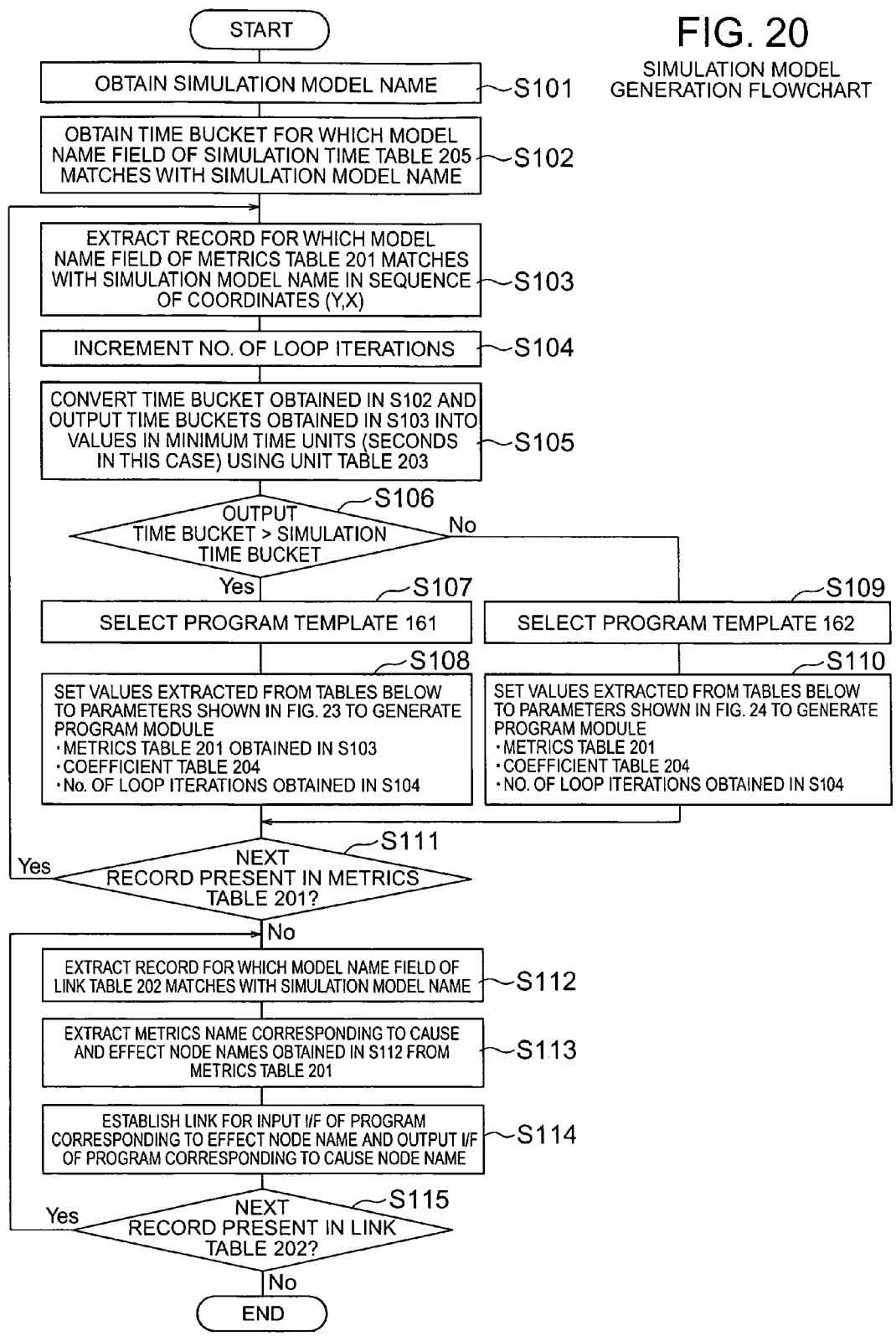
FIG. 20 is a flowchart showing simulation model creation.

FIG. 20 is a flowchart of processing to generate a simulation model. First, the simulation model generation module 16 obtains a simulation model name to create a simulation model (step 101).

Next, the generation module 16 obtains a time bucket for which the model field of the simulation time bucket table 205 matches with the simulation model name (step 102). Next, the generation module 16 extracts a record for which the model name field of the metrics table 201 matches with the simulation field name in an order of coordinates (X,Y) and then increments the number of loop iterations (steps 103 and 104).

Figure 21:
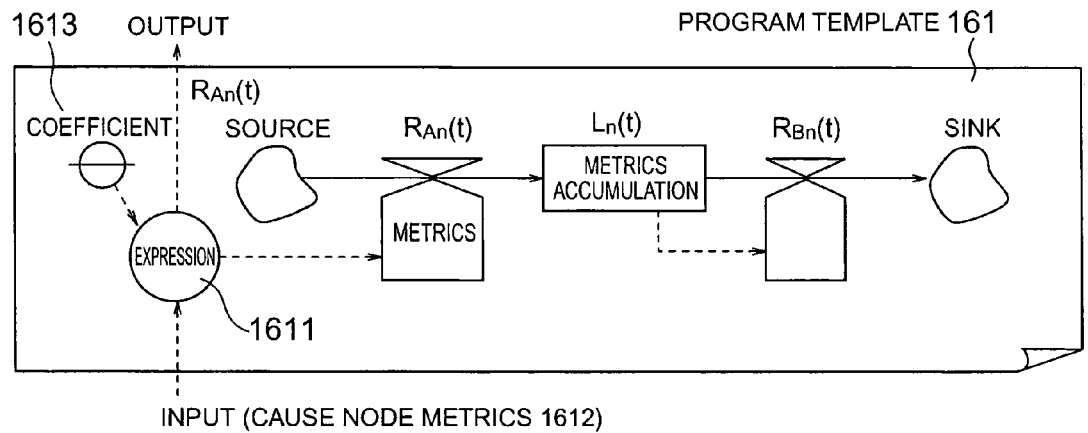
FIG. 21 is a diagram showing an image of a program template 161.

In step 105, using the unit table 203, the time bucket obtained in steps 102 and 103 is converted into a value expressed in the minimum time units. The output time bucket is compared with the simulation time bucket (step 106). If the output time bucket is larger, a program template 161 shown in FIG. 21 is selected. To the program template 161, the metrics table 201 and the coefficient table 204 obtained in step 103 and the number of loop iterations obtained in step 104 are set according to the correspondence shown in FIG. 23 to thereby create a program module (steps 107 and 108).

Description will now be given of the meaning of the program template 161 shown in FIG. 21. This is a template of a program (for data accumulation) to calculate RAn(t) and an accumulated amount of data of RAn(t) during a period of the output time bucket according to a function (expression 1611) using a metrics item 1612 and a coefficient 1613 of the cause node.

In FIG. 21, RAn(t) is a flow rate of inflow (rate An) at a point of time t on the simulation time. The flow rate is equal to the quantity of the metrics item. RBn(t) is a flow rate of inflow (rate Bn) at a point of time t on the simulation time. Ln(t) is an accumulated amount (level n) at a point of time t and is represented as a function of expression (1).

In expression (1), dt is a simulation time bucket. RBn(t) is represented as a function of expression (2). In this connection, T is an output time bucket (time constant), t0 is a simulation start point of time, and t1 is a point of time when a pulse first appears. Expression 1611 is a function to calculate the value of RAn(t).

$$L_n(t) = L_n(t-dt) + [R_{An}(t) - R_{Bn}(t)]dt \qquad (1)$$

$$R_{Bn}(t) = R_{Bn}(t_0) + L_n(t-dt)\left(1 - e^{\frac{t-t_0}{t_1}}\right)^P \cdot e^{\frac{t-t_0}{T}} \qquad (2)$$

Figure 22:
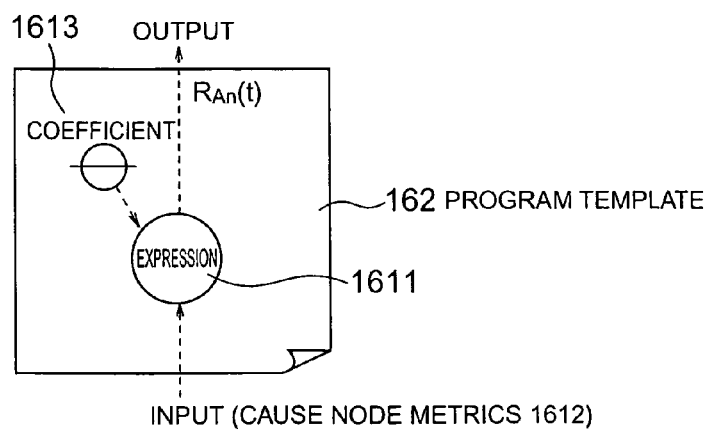
FIG. 22 is a diagram showing an image of a program template 162.
Figure 23:
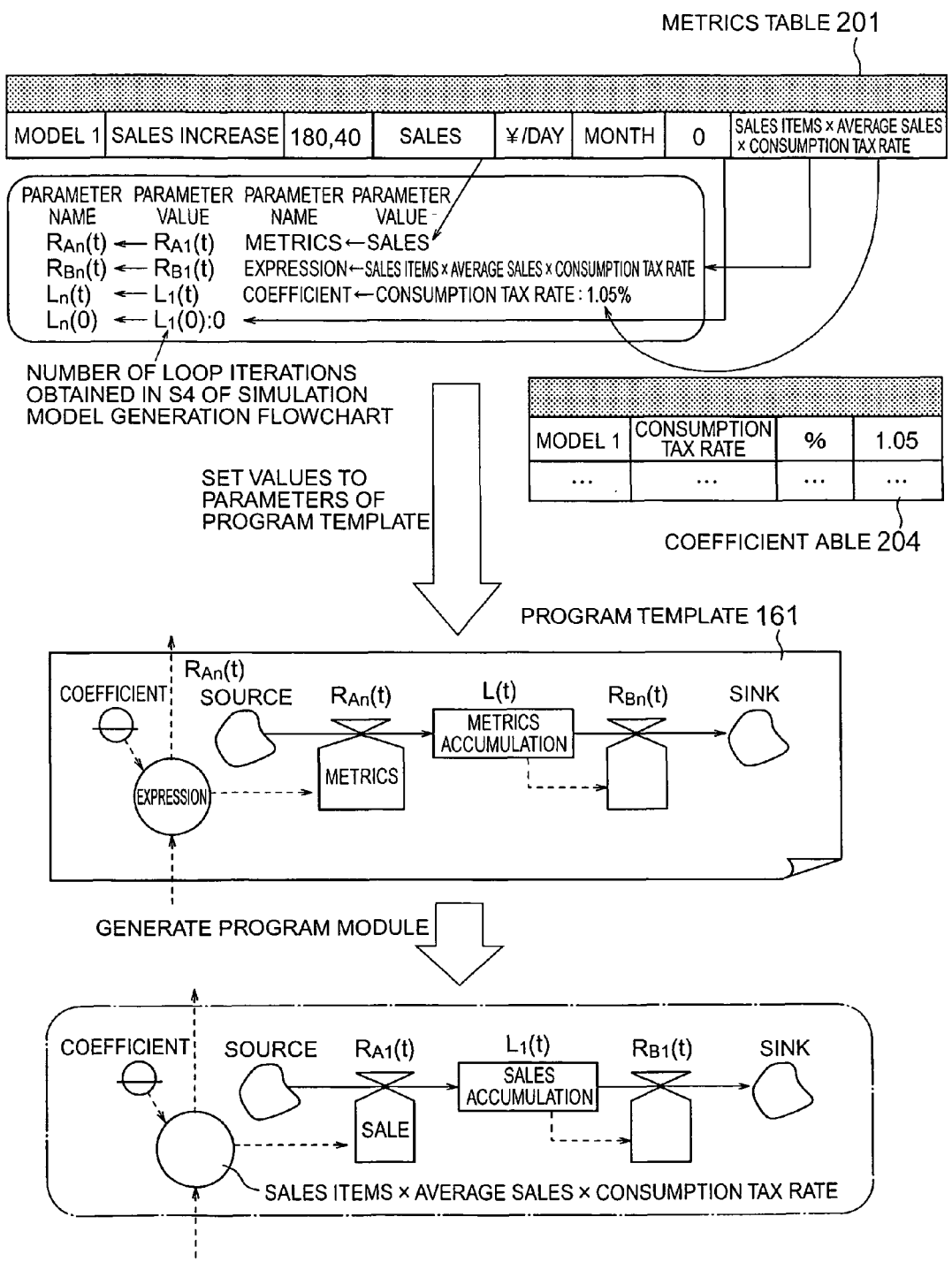
FIG. 23 is a diagram showing an image of the program module creation using the program template 161.
Figure 24:
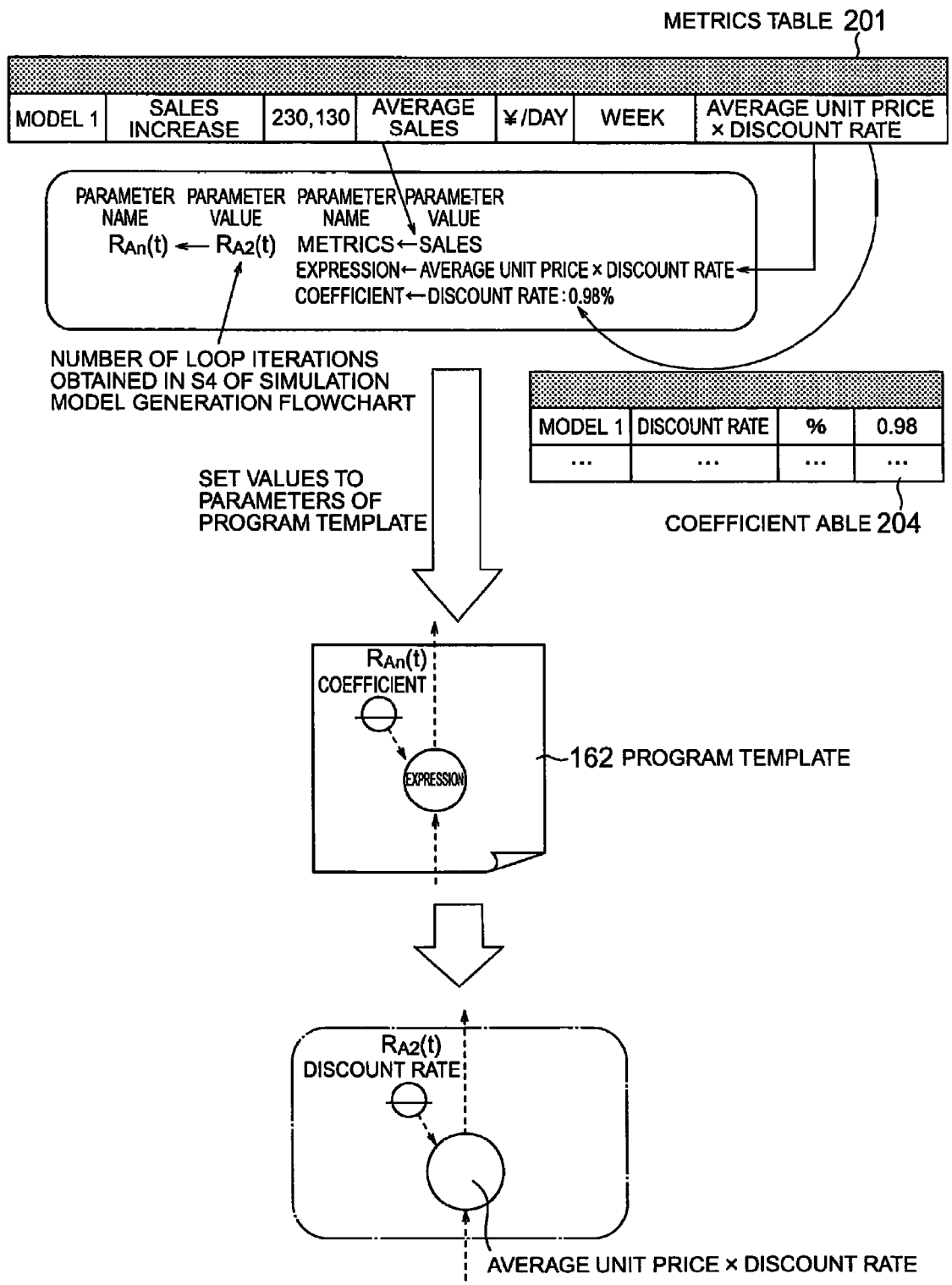
FIG. 24 is a diagram showing an image of the program module creation using the program template 162.

In step 106 of FIG. 20, if the output bucket is equal to or less than the simulation time bucket, the program template 162 shown in FIG. 22 is selected. To the program template 162, the metrics table 201 and the coefficient table 204 obtained in step 103 and the number of loop iterations obtained in step 104 are set according to the correspondence shown in FIG. 24 to thereby create a program module (steps 109 and 110).

Description will now be given of the meaning of the program template 162 shown in FIG. 22. This is a template of a program (for flow rate calculation) to calculate a flow rate of RAn(t) according to the function (expression 1611) using the metrics item 1612 and the coefficient 1613 of the cause node. If the next record is present in the metrics table 201, the system repeatedly executes step 103 (step 111).

In step 112 of FIG. 20, a record for which the model name field of the link table 202 matches with the simulation model is extracted. Subsequently, in step 113, a metrics name corresponding to the cause node name and the effect node name is extracted from the metrics table 201.

Thereafter, a link is established for an input interface (I/F) of the program corresponding to the metrics item of the effect node name and an output interface of the program corresponding to the metrics item of the cause node name (step 114). Finally, a check is made to determine presence or absence of the next record in the link table 202. If the next record is present, the process returns to step 112; otherwise, the processing is terminated (step 115).

Figure 25:
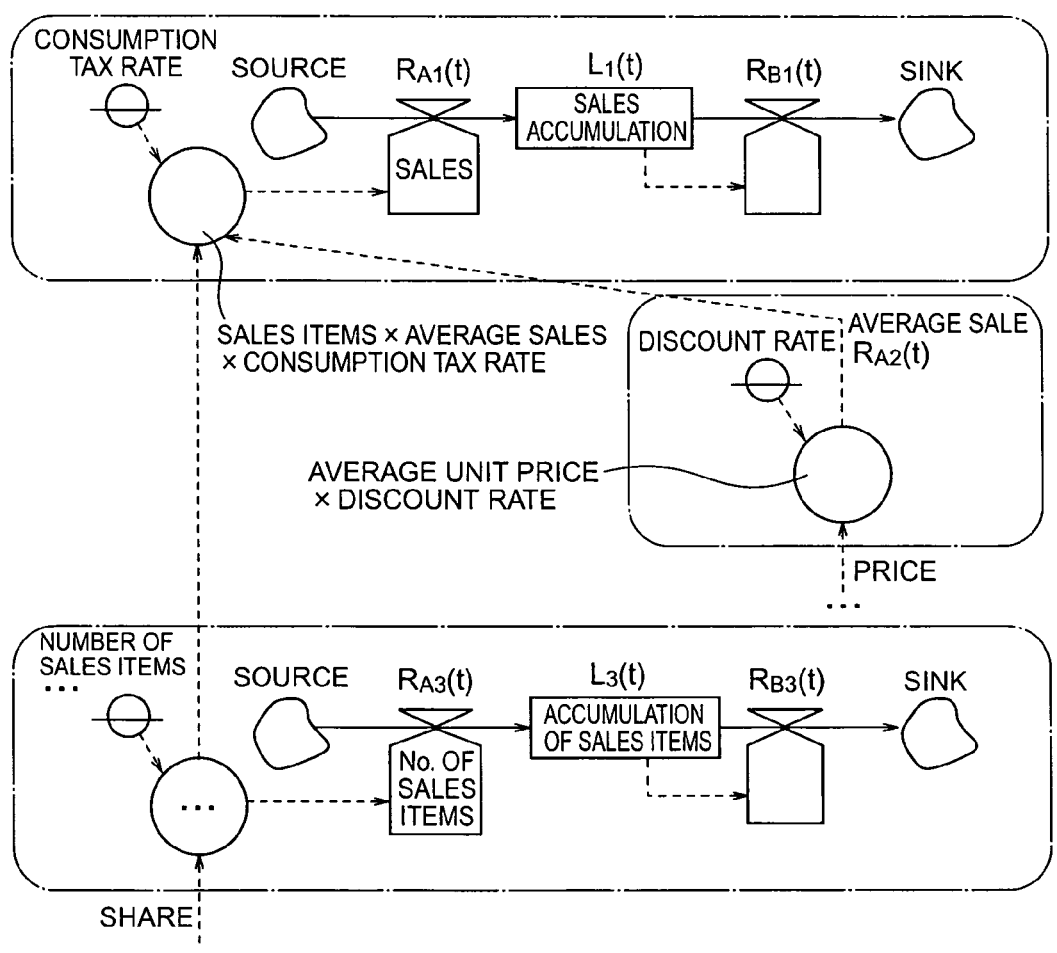
FIG. 25 is a diagram showing an image of a simulation model automatically generated.

FIG. 25 shows an image of a simulation model produced after the processing of the flowchart is executed. As can be seen from the FIG. 25, the simulation model includes a combination of a plurality of programs generated using a program template.

Since it is required that the simulation model is expressed to be understood by the simulator 4, the data is stored in the memory 32, for example, as a simulation model table 206 shown in FIG. 26.

As shown in the simulation model table 206, each entry thereof includes a model name field, an object name field, a type field, a size field, a metrics field, a metrics initial value field, and an expression field. The object name is a variable name used in the expression. The type is a type of the variable and includes a rate, a level, and a coefficient.

If the type is set to "rate", there are disposed an object size field, an associated metrics name field, a unit field, and an expression field. If the type is set to "level", there are disposed an object size field, an associated metrics initial value field, and an expression field. If the type is set to "coefficient", there are disposed an object size field and an associated metrics initial value field.

Figure 27:
FIG. 27 is a diagram showing an image of a simulation data table.

In this connection, the object size is an area size of a variable. An object for which the type is "coefficient" is a variable not exerting influence on a change in time series, and hence the size is set to "1". An object for which the type is "rate" or "level" and which changes in time series, and hence a size of "tend" is required as an array. In this regard, "tend" indicates a simulation period of time. The expression field is disposed to register thereto an equation to calculate each variable. The simulation data table 207 of FIG. 27 shows an image of a table to actually store the variables described above. Each entry of the table 207 includes, for each simulation model, a utilization variable (object name) field and a value field to store an execution result.

If the type of the object is "rate", arrays whose values are all null are registered according to the size "tend" as shown in FIG. 27. In this operation, "null" indicates that the result is undetermined until the simulation is executed. If the object type is "level", the value of the metrics initial value field of the simulation model table 206 is registered only for the simulation point of time "0". In other points of time, null is registered as the value. If the object type is "coefficient", the value of the metrics initial value field is registered.

Figure 28:
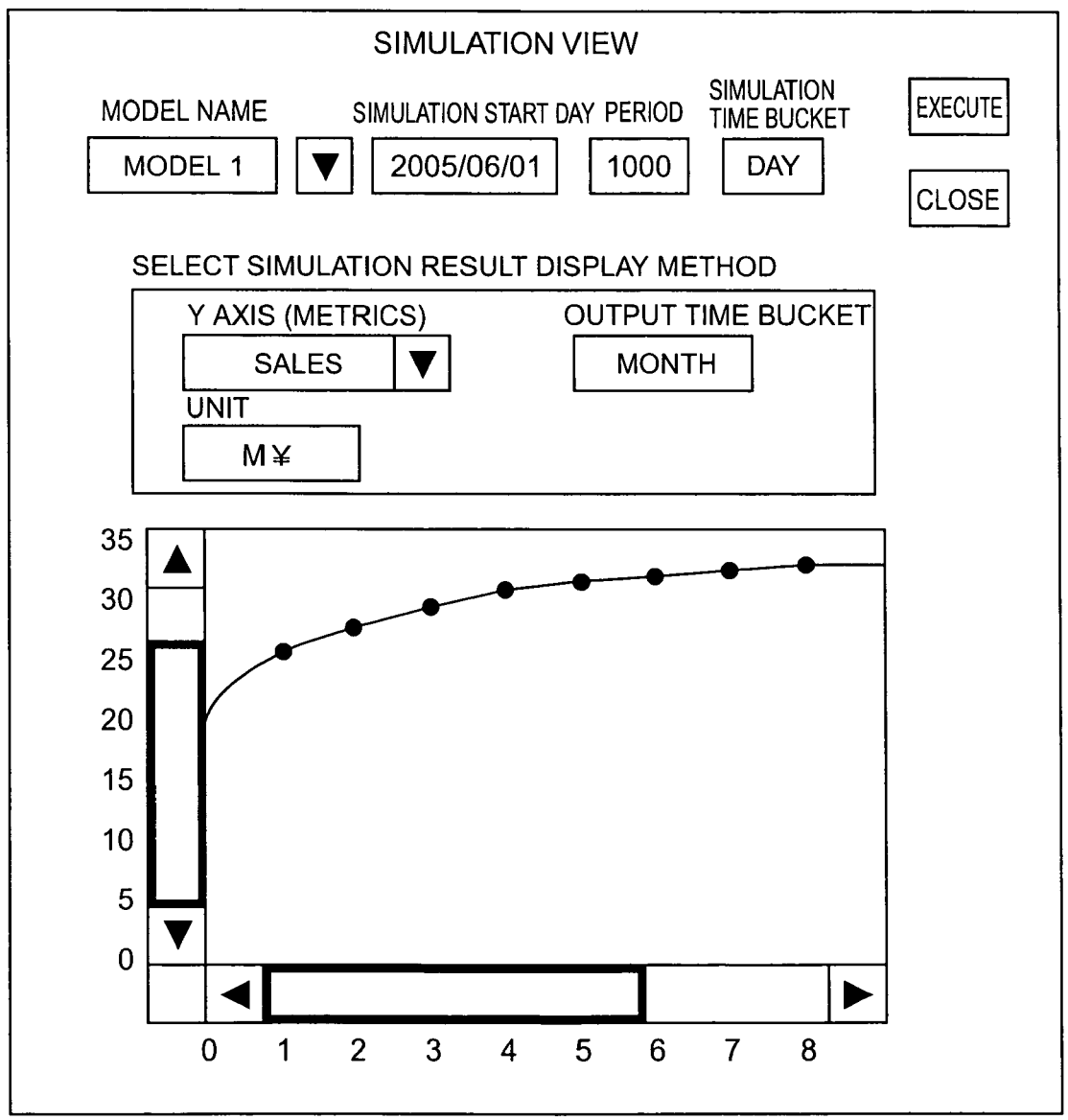
FIG. 28 is a diagram showing an image of a simulation view.

Subsequently, description will be given of the function of the simulator to execute the simulation model generated as above. FIG. 28 shows an image of a simulation view. When the user selects a model for simulation from the list and clicks the execute button, the system extracts from the simulation model table 206 data corresponding to the simulation model selected by the user and then conducts simulation. Results of execution of the simulation are stored in the simulation data table 207, and the metrics names created according to the simulation model are displayed in a list along the Y axis.

When the user selects a metrics item for the browsing thereof from the menu, the system extracts from the simulation table 207 a record for which the object name matches with the metrics item thus selected. The system converts the value of the record into a value in the metrics units to resultantly display a graph with the output time bucket taken along the X axis. The user therefore can confirm results of execution of the simulation by visually checking the graph.

Figure 29:
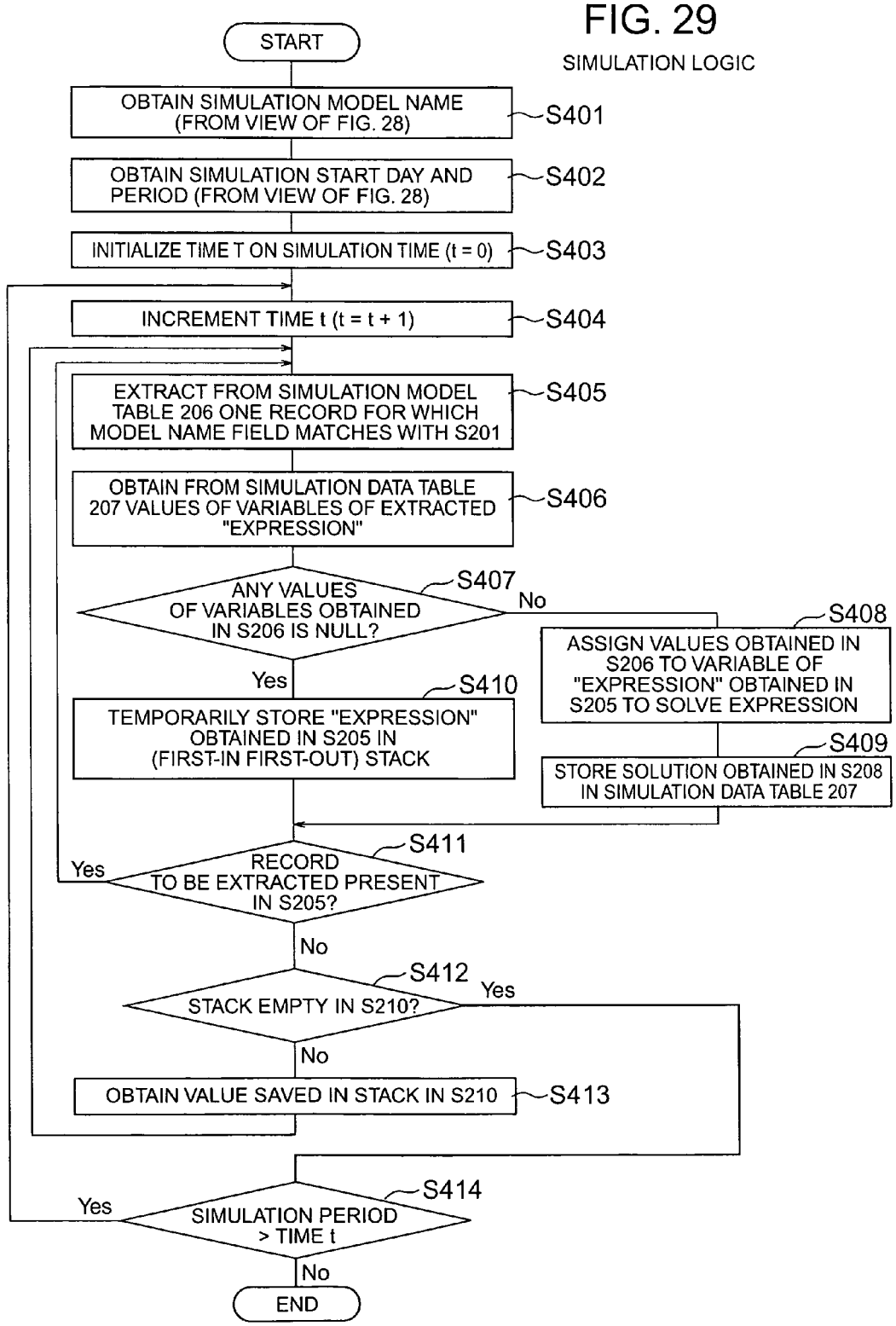
FIG. 29 is a flowchart showing a simulation logic of a simulator.
Figure 30:
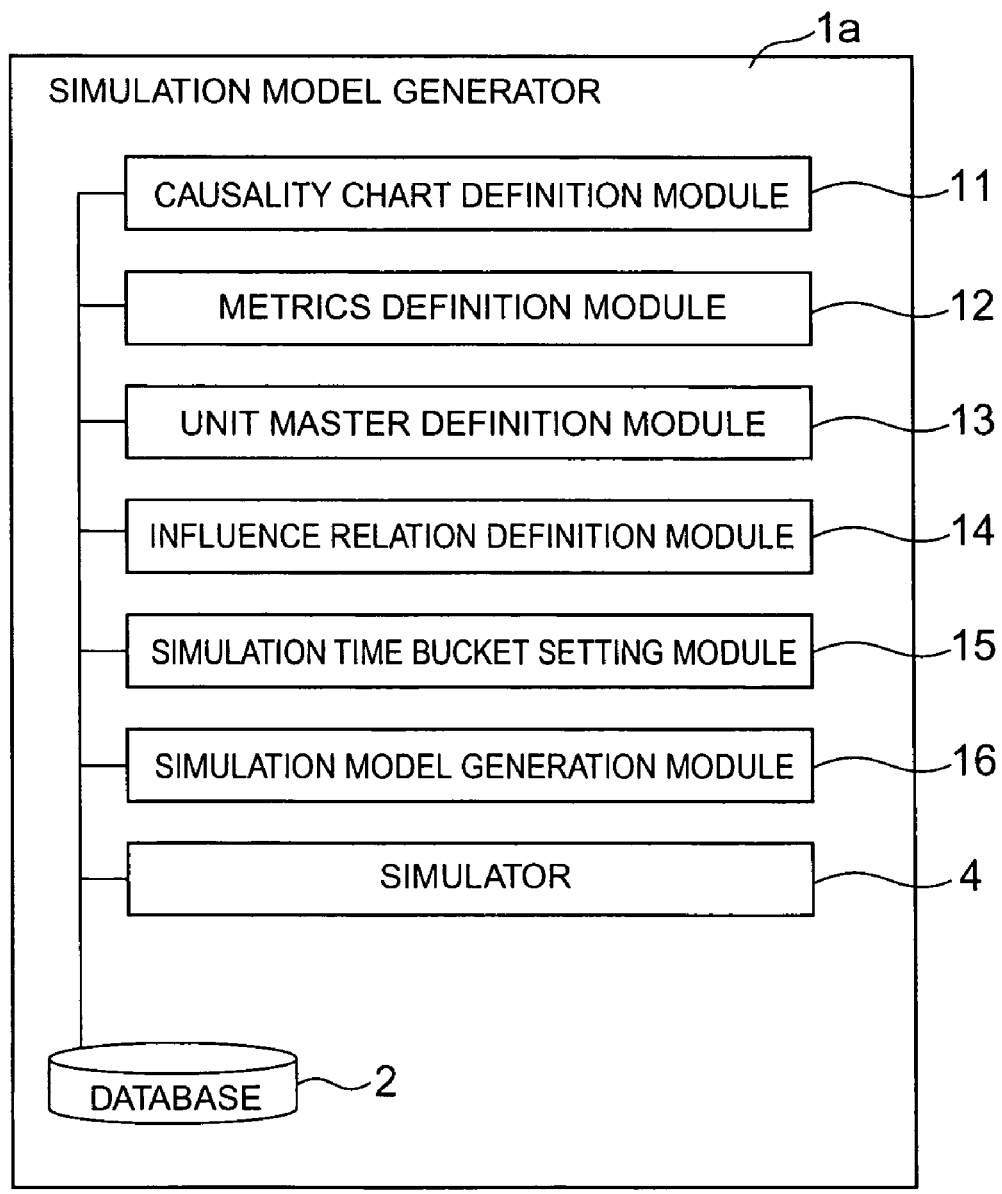
FIG. 30 is a block diagram showing another embodiment of an information processing system implementing a simulation model generator according to the present invention.

The system finally outputs the values to the simulation data table 207. Referring now to FIGS. 29 and 30, description will be given of the flowchart of the simulation logic of the simulator and another embodiment of the system.

FIG. 29 is a flowchart of the simulation logic of the simulator 4. First, the system obtains a name of a model for simulation, a simulation start day, and a period of simulation (steps 401 and 402). The system then initializes the time (t) on the simulation (t=0; step 403). Next, the point of time t is incremented by one (t=t+1; step 404). In step 405, the system extracts from the simulation model table 406 a record for which the model name field matches with the model name obtained in step 401. The system obtains from the simulation data table 207 a value of each variable of the calculation formula registered to the expression field of the record thus extracted (step 406).

If the value of the variable obtained as above is other than null (step 407), the obtained value is assigned to each variable of the expression indicated by the expression field obtained in step 405 to solve the expression (step 408). The solution is then stored in the simulation data table 407 (step 409).

If the value of the variable obtained as above is null, the value of the expression field obtained in step 405 is temporarily saved in a first-in first-out stack. If the subsequent record is present in step 405, the operation is repeatedly conducted again (step 411). If the stack contains a value in step 410 (step 412), the system obtains the value from the stack in the first-in first-out way (step 413) and then returns to step 405. If the stack is empty in step 412, the simulation period is compared with the point of time t. If the time t is before the simulation period, the step 404 is executed; otherwise, the processing is terminated (step 414).

FIG. 30 shows another embodiment of the system in a block diagram. It is also possible that a simulation model generator 1a includes the simulator 4. According to this embodiment, by defining the causality structure, the influence relationships between metrics items, the metrics output time bucket, and the simulation time bucket as described above, a simulation model is automatically generated to thereby conduct simulation. This remarkably reduces the simulation model construction period. It is possible for even non-experts having little knowledge about the system dynamics to create a simulation model and to conduct simulation.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A simulation model generator for generating a simulation model of a simulator which conducts simulation by representing phenomena and events in terms of causality, comprising:

a module for presenting a first screen view which defines causality between the phenomena and the events using nodes having definitions of the phenomena and events and links representing the casualty among nodes to a user, receiving inputs from the user, and registering information regarding each of the nodes, information regarding each of the links, and information of cause and effect connecting nodes to each other to a database;

means for representing a second screen view and, in response thereto, for each of the nodes, receiving and registering a record of metric information including data of at least a metric name, a unit, a metric calculation formula, and an output time bucket indicating a period of time for totaling results of calculation to the database;

means for representing a third screen view and, in response thereto, for receiving selection of a node by a user, for receiving and registering a user's input of a record including data of, for each unit, at least a unit name, a coefficient, a base unit, and a time flag determining whether or not the unit is associated with time to the database;

means for representing a fourth screen view and, in response thereto, for receiving selection of a node by a user, for extracting a cause node linked with an effect node under the selection by the user, representing a metrics name and a unit registered in the cause node, and receiving and registering metrics calculation formula of the effect node under the selection including data of the coefficient, the unit, and the metrics name to the database;

means for representing a fifth screen view of a data list of the unit data registered, and for setting and registering a simulation time bucket representing a period of time per time step in the simulation to the database; and a simulation model generating module for obtaining a simulation model name and a simulation time bucket registered for the casuaty defined with the nodes and the links from the database and obtaining the metrics information for each of the nodes under the simulation model name from the database, for generating, if the time bucket from the metrics information is larger than the simulation time bucket, a program module by applying a program template for data accumulation to the metrics calculation formula $R_{An}(t)$ for the flow rate of inflow (rate An) at a point of time t on the simulation time, the flow rate of inflow (rate Bn) at a point of time t on the simulation time, and the accumulated amount $Ln(t)$ (Level n) at a point of time t, and for generating, if the time bucket is equal to or less than the simulation time bucket, a program module by applying a program template for data accumulation to the metrics calculation formula $R_{An}(t)$ for the flow rate of inflow (rate An), and for establishing link of the casualty among the program modules of the nodes.

2. The simulation model generator according to claim 1, wherein the metric information further includes node names representing factors of the causality and management targets, the simulation model generator further comprising:
- link information including a cause node name and an effect node name which indicate at least one causality between factors; and
- a causality defining module for registering the node information and the link information to the database.

3. The simulation model generator according to claim 1, wherein the metric information further includes node names representing factors of the causality and management targets, the simulation model generator further comprising:
- link information including a cause node name and an effect node name which indicate at least one causality between factors; and
- a causality defining module for registering the node information and the link information to the database.

* * * * *